(12) United States Patent
Ando et al.

(10) Patent No.: US 9,985,206 B1
(45) Date of Patent: May 29, 2018

(54) RESISTIVE SWITCHING MEMORY STACK FOR THREE-DIMENSIONAL STRUCTURE

(71) Applicant: INTERNATIONAL BUSINESS MACHINES CORPORATION, Armonk, NY (US)

(72) Inventors: Takashi Ando, Tuckahoe, NY (US); Vijay Narayanan, New York, NY (US); John Rozen, Hastings on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/421,659

(22) Filed: Feb. 1, 2017

(51) Int. Cl.
*H01L 45/00* (2006.01)
*H01L 27/24* (2006.01)

(52) U.S. Cl.
CPC ........ *H01L 45/146* (2013.01); *H01L 27/2481* (2013.01); *H01L 45/085* (2013.01); *H01L 45/1253* (2013.01); *H01L 45/1616* (2013.01)

(58) Field of Classification Search
CPC ............... H01L 45/146; H01L 45/1233; H01L 45/1253; H01L 45/1616
See application file for complete search history.

(56) References Cited

U.S. PATENT DOCUMENTS

| | | | | |
|---|---|---|---|---|
| 7,800,094 B2 * | 9/2010 | Ho | ..................... | B82Y 10/00 257/4 |
| 8,144,498 B2 * | 3/2012 | Kumar | ............... | G11C 13/0007 365/100 |
| 8,362,457 B2 * | 1/2013 | Kim | ................... | G11C 13/0007 257/4 |
| 8,492,742 B2 * | 7/2013 | Tamai | .................... | H01L 45/08 257/4 |
| 8,614,148 B2 * | 12/2013 | Park | ...................... | H01L 21/308 257/E21.258 |
| 8,766,228 B2 * | 7/2014 | Yang | .................. | H01L 21/2254 257/214 |
| 2013/0210193 A1 | 8/2013 | Lee et al. | | |
| 2014/0319443 A1 | 10/2014 | Wang et al. | | |
| 2015/0016178 A1 | 1/2015 | Nardi et al. | | |
| 2015/0021537 A1 | 1/2015 | Xie et al. | | |

OTHER PUBLICATIONS

Baek, et al., "Realization of Vertical Resistive Memory (VRRAM) using cost effective 3D Process", IEEE, Dec. 2011, 4 pages.
Wong, et al., "Metal-Oxide RRAM", Proceedings of the IEEE, Jun. 2012, vol. 100, No. 6, pp. 1951-1970.

* cited by examiner

*Primary Examiner* — Allison P Bernstein
(74) *Attorney, Agent, or Firm* — Tutunjian & Bitetto, P.C.; Vazken Alexanian

(57) ABSTRACT

A resistive switching memory stack is provided. The resistive switching memory stack includes a bottom electrode, formed from one or more metals. The resistive switching memory stack further includes a metal oxide layer, disposed over the bottom electrode, formed from an Atomic Layer Deposition (ALD) of one or more metal oxides. The resistive switching memory stack also includes a top electrode, disposed over the metal oxide layer, formed from the ALD of a plurality of metals into a metal layer stack. An oxygen vacancy concentration of the resistive switching memory stack is controlled by (i) a thickness of the plurality of metals forming the top electrode and (ii) a percentage of a particular one of the plurality of metals in the metal layer stack of the top electrode.

17 Claims, 4 Drawing Sheets

US 9,985,206 B1

RESISTIVE SWITCHING MEMORY STACK FOR THREE-DIMENSIONAL STRUCTURE

BACKGROUND

Technical Field

The present invention relates generally to memory devices and, in particular, to a resistive switching memory stack for a three-dimensional structure.

Description of the Related Art

Resistive random access memory (a.k.a. RRAM or ReRAM) is considered as a promising technology for electronic synapse devices or memristor for neuromorphic computing as well as high-density and high-speed non-volatile memory application.

In neuromorphic computing applications, a resistive memory device can be used as a connection (synapse) between a pre-neuron and post-neuron, representing the connection weight in the form of device resistance.

Multiple pre-neurons and post-neurons can be connected through a crossbar array of RRAMs, which naturally expresses a fully-connected neural network.

The density of ReRAM can be increased by vertically stacking ReRAM stacks as practiced in Flash NAND technology, however, ReRAM stacks are typically deposited by Physical Vapor Deposition (PVD) to control the oxygen vacancy concentration in the metal oxide layer and this prevents application to three-dimensional (3D) structures.

Thus, there is a need for RRAM for 3D structures.

SUMMARY

According to an aspect of the present invention, a resistive switching memory stack is provided. The resistive switching memory stack includes a bottom electrode, formed from one or more metals. The resistive switching memory stack further includes a metal oxide layer, disposed over the bottom electrode, formed from an Atomic Layer Deposition (ALD) of one or more metal oxides. The resistive switching memory stack also includes a top electrode, disposed over the metal oxide layer, formed from the ALD of a plurality of metals into a metal layer stack. An oxygen vacancy concentration of the resistive switching memory stack is controlled by (i) a thickness of the plurality of metals forming the top electrode and (ii) a percentage of a particular one of the plurality of metals in the metal layer stack of the top electrode.

According to another aspect of the present invention, a method is provided for forming a resistive switching memory stack. The method includes forming a bottom electrode from one or more metals. The method further includes forming a metal oxide layer, disposed over the bottom electrode, from and Atomic Layer Deposition (ALD) of one or more metal oxides. The method also includes forming a top electrode, disposed over the metal oxide layer, from the ALD of a plurality of metals into a metal layer stack. An oxygen vacancy concentration of the resistive switching memory stack is controlled by (i) a thickness of the plurality of metals forming the top electrode and (ii) a percentage of a particular one of the plurality of metals in the metal layer stack of the top electrode.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
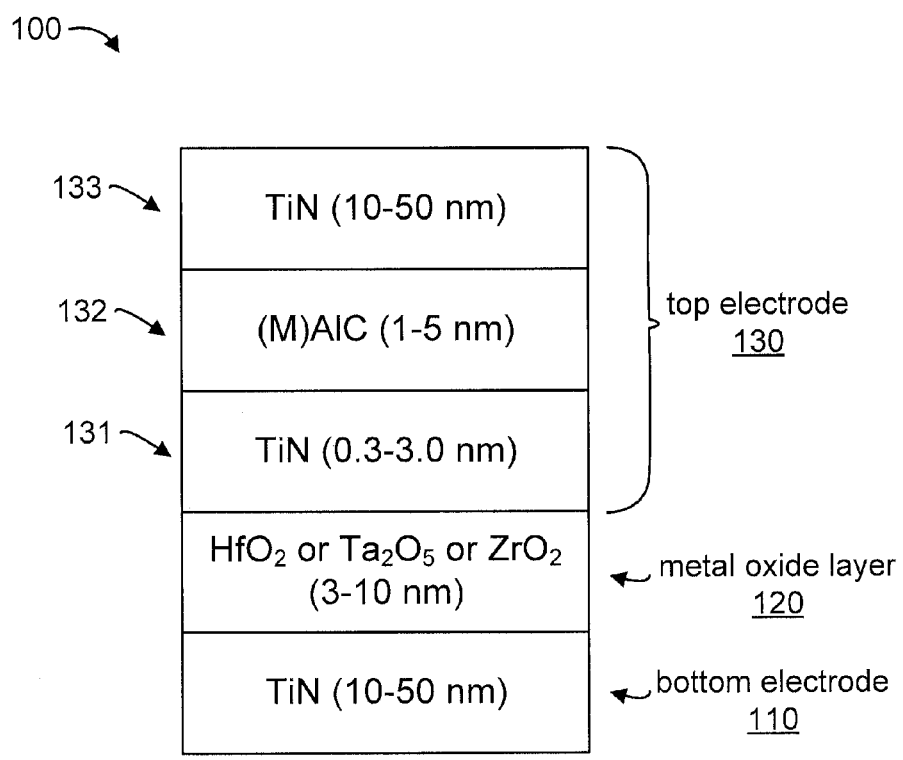
FIG. 1 shows an exemplary resistive switching memory stack 100 for a 3D structure, in accordance with an embodiment of the present invention.

The present invention is directed to a resistive switching memory stack for a three-dimensional structure. The resistive switching memory stack can be used for, but is not limited to, Resistive Random Access Memories (RRAMs), neuromorphic computing applications, and so forth.

In an embodiment, a metal-insulator-metal stack is formed. The bottom electrode is formed from TiN, deposited by Atomic layer Deposition (ALD), Chemical Vapor Deposition (CVD), or Physical Vapor Deposition (PVD). ALD $HfO_2$ or $Ta_2O_5$ or $ZrO_2$ are used as base oxides. The top electrode is formed as an ALD TiN/(M)AlC/TiN stack, where M is a transition metal such as, but not limited to, Ti, Ta, and Nb. Regarding the top electrode, oxygen vacancy concentration is controlled by the TiN/(M)AlC thicknesses and Al % in the (M)AlC layer of the top electrode.

The metal-insulator-metal stack can be all deposited by ALD and applicable to a 3D structure including, but not limited to any of the following: a Vertical Restive Random Access Memory (VRRAM); a deep Trench in Front End of Line (FEOL); a cylinder trench in Back End of Line (BEOL); and a fin structure. It is to be appreciated that the preceding 3D structures are merely illustrative and, thus, the present invention can be readily applied to other 3D structures are readily contemplated by one of ordinary skill in the art given the teachings of the present invention provided herein, while maintaining the spirit of the present invention.

As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure.

As used herein, a "metal" is an electrically conductive material, wherein metals atoms are held together by the force of metallic bonds, and the energy band structure of the metal's conduction and valence bands overlap, and hence, there is no energy gap.

As used herein, the term "memory device" means a structure in which the electrical state can be altered and then retained in the altered state, in this way a bit of information can be stored.

Atomic Layer Deposition (ALD) is a thin film deposition method in which a film is grown on a substrate by exposing its surface to alternate gaseous species (typically referred to as precursors). In contrast to chemical vapor deposition, the precursors in ALD are never present simultaneously in the reactor, but instead are inserted as a series of sequential, non-overlapping pulses. In each pulse, the precursor molecules react with the surface in a self-limiting way, so that the reaction terminates once all the reactive sites on the surface are consumed. Consequently, the maximum amount of material deposited on the surface after a single exposure to all of the precursors (a.k.a. an ALD cycle) is determined by the nature of the precursor-surface interaction. By varying the number of ALD cycles, it is possible to grow materials uniformly and with high precision on arbitrarily complex and large substrates such as three-dimensional structures.

FIG. 1 shows an exemplary resistive switching memory stack 100 for a 3D structure, in accordance with an embodiment of the present invention. It is to be appreciated that the elements of stack 100 are not shown drawn to scale, for the sakes of illustration and clarity.

The resistive switching memory stack 100 includes a bottom electrode 110, a metal oxide layer 120, and a top electrode 130. The metal oxide layer 120 is disposed over the bottom electrode 110, and the top electrode 130 is disposed over the metal oxide layer 120.

The bottom electrode 110 is formed from TiN. In an embodiment, the bottom electrode 110 is 10-50 nm thick.

The metal oxide layer 120 is formed from $HfO_2$ or $Ta_2O_5$ or $ZrO_2$. In an embodiment, the metal oxide layer 120 is 3-10 nm thick.

The top electrode 130 includes a bottom layer 131, an intermediate layer 132, and a top layer 133.

The bottom layer 131 is formed from TiN. In an embodiment, the bottom layer 131 is 0.3-3.0 nm thick.

The intermediate layer 132 is formed from (M)AlC, where M is a transition metal and can be, but is not limited to, e.g., Ti, Ta, Nb, and so forth. In an embodiment, the intermediate layer 132 is 1-5 nm thick.

The top layer 133 is formed from TiN. In an embodiment, the top layer 133 is 10-50 nm thick.

It is to be appreciated that various changes can be made to the structure shown in FIG. 1. For example, the TiN thickness can be reduced, and low resistivity metals (e.g., W, Al, Cu, and so forth) can be added to the bottom and top electrodes. These and other variations to the structure of FIG. 1 are readily determined by one of ordinary skill in the art given the teachings of the present invention provided herein, while maintaining the spirit of the present invention.

Figure 2:
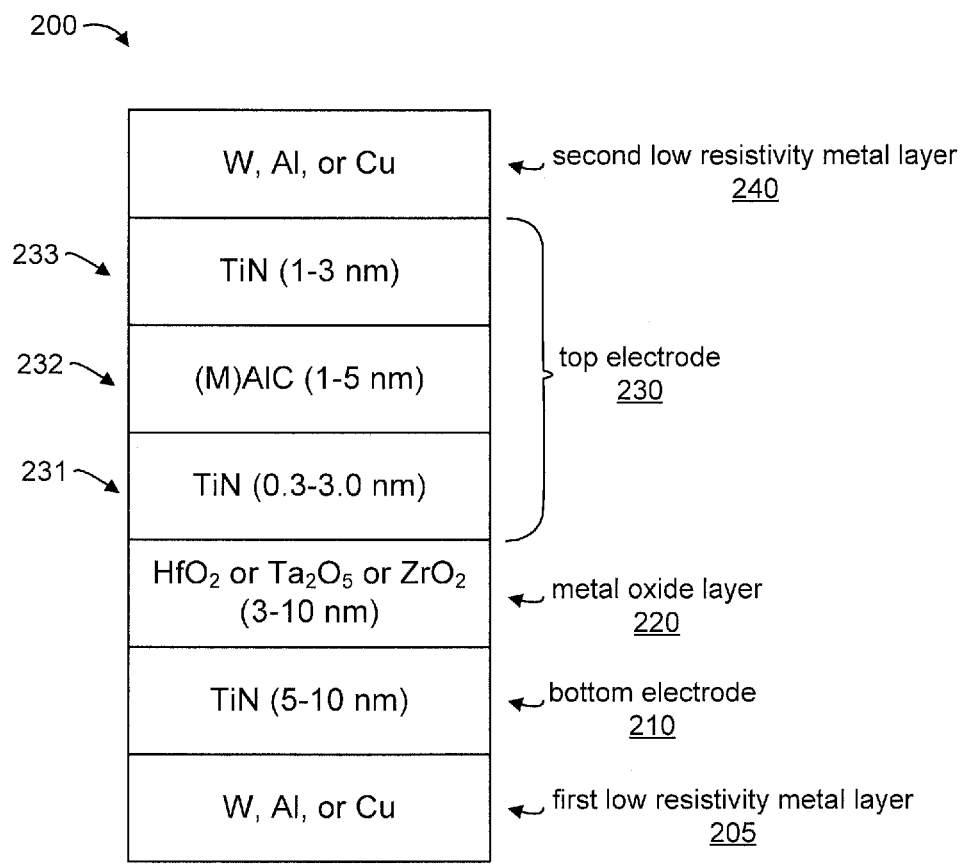
FIG. 2 shows another exemplary resistive switching memory stack 200 for a 3D structure, in accordance with an embodiment of the present invention.

FIG. 2 shows another exemplary resistive switching memory stack 200 for a 3D structure, in accordance with an embodiment of the present invention. It is to be appreciated that the elements of stack 200 are not shown drawn to scale, for the sakes of illustration and clarity.

The resistive switching memory stack 200 includes a first low resistivity metal layer 205, a bottom electrode 210, a metal oxide layer 220, a top electrode 230, and a second low resistivity metal layer 240.

The bottom electrode 210 is disposed over the first low resistivity metal layer 205, the metal oxide layer 220 is disposed over the bottom electrode 210, the top electrode 230 is disposed over the metal oxide layer 220, and the second low resistivity metal layer 240 is disposed over the top electrode 230.

The first low resistivity metal layer 205 is formed from one or more of W, Al, and/or Cu.

The bottom electrode 210 is formed from TiN. In an embodiment, the bottom electrode 210 is 5-10 nm thick.

The metal oxide layer 220 is formed from $HfO_2$ or $Ta_2O_5$ or $ZrO_2$. In an embodiment, the metal oxide layer 220 is 3-10 nm thick.

The top electrode 230 includes a bottom layer 231, an intermediate layer 232, and a top layer 233.

The bottom layer 231 is formed from TiN. In an embodiment, the bottom layer 231 is 0.3-3.0 nm thick.

The intermediate layer 232 is formed from (M)AlC, where M is a transition metal. In an embodiment, the intermediate layer 232 is 1-5 nm thick.

The top layer 233 is formed from TiN. In an embodiment, the top layer 233 is 1-3 nm thick.

The second low resistivity metal layer 240 is formed from one or more of W, Al, and/or Cu. It is to be appreciated that the metals can be the same or different between the first low resistivity metal layer 205 and the second low resistivity metal layer 240.

It is to be appreciated that the stacks shown in FIGS. 1 and 2 can be formed on respective insulator films. The insulator films include but are not limited to: any interlayer dielectric materials used for semiconductor processing, such as SiO2, SiN, or low k materials (e.g., SiCOH).

Figure 3:
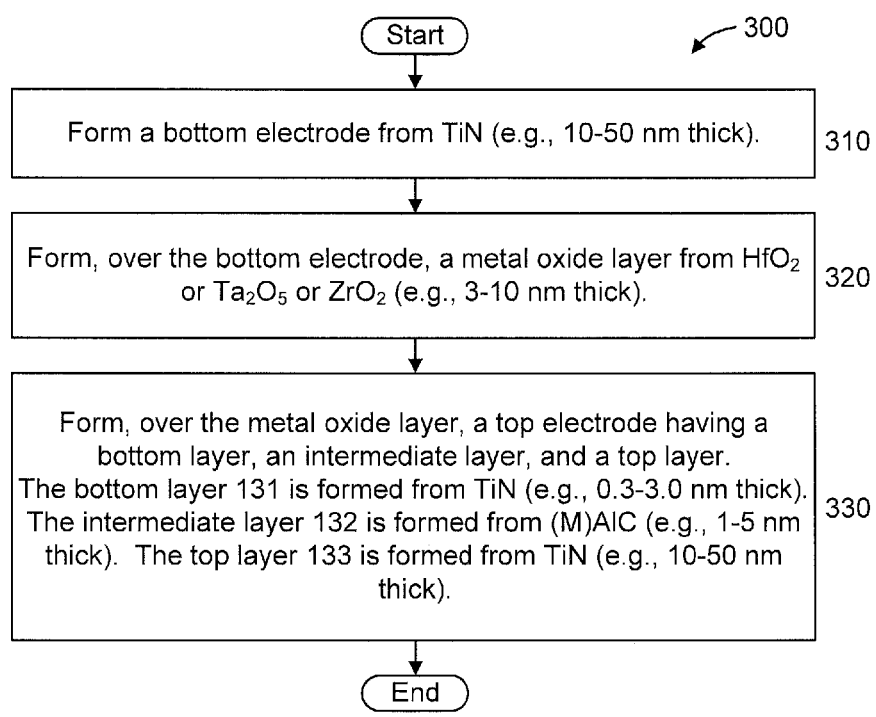
FIG. 3 shows an exemplary method 300 for forming a resistive switching memory stack for a 3D structure, in accordance with an embodiment of the present invention.

FIG. 3 shows an exemplary method 300 for forming a resistive switching memory stack for a 3D structure, in accordance with an embodiment of the present invention. The method 300 can form the stack, for example, with respect to any of the following: a Vertical Restive Random Access Memory (VRRAM); a deep Trench in Front End of Line (FEOL); a cylinder trench in Back End of Line (BEOL); and a fin structure.

At step 310, form a bottom electrode from TiN. In an embodiment, the bottom electrode 110 is 10-50 nm thick. Of course, other metals and/or thicknesses can be used for the bottom electrode, while maintaining the spirit of the present invention.

At step 320, form, over the bottom electrode, a metal oxide layer from $HfO_2$ or $Ta_2O_5$ or $ZrO_2$. In an embodiment, the metal oxide layer is 3-10 nm thick. Of course, other metals and/or thicknesses can be used for the metal oxide layer, while maintaining the spirit of the present invention.

At step 330, form, over the metal oxide layer, a top electrode having a bottom layer, an intermediate layer, and a top layer. The bottom layer 131 is formed from TiN. In an embodiment, the bottom layer 131 is 0.3-3.0 nm thick. The intermediate layer 132 is formed from (M)AlC, where M is a transition metal. In an embodiment, the intermediate layer 132 is 1-5 nm thick. The top layer 133 is formed from TiN. In an embodiment, the top layer 133 is 10-50 nm thick. Of course, other metals and/or thicknesses can be used for each of the layers of the top electrode, while maintaining the spirit of the present invention.

Figure 4:
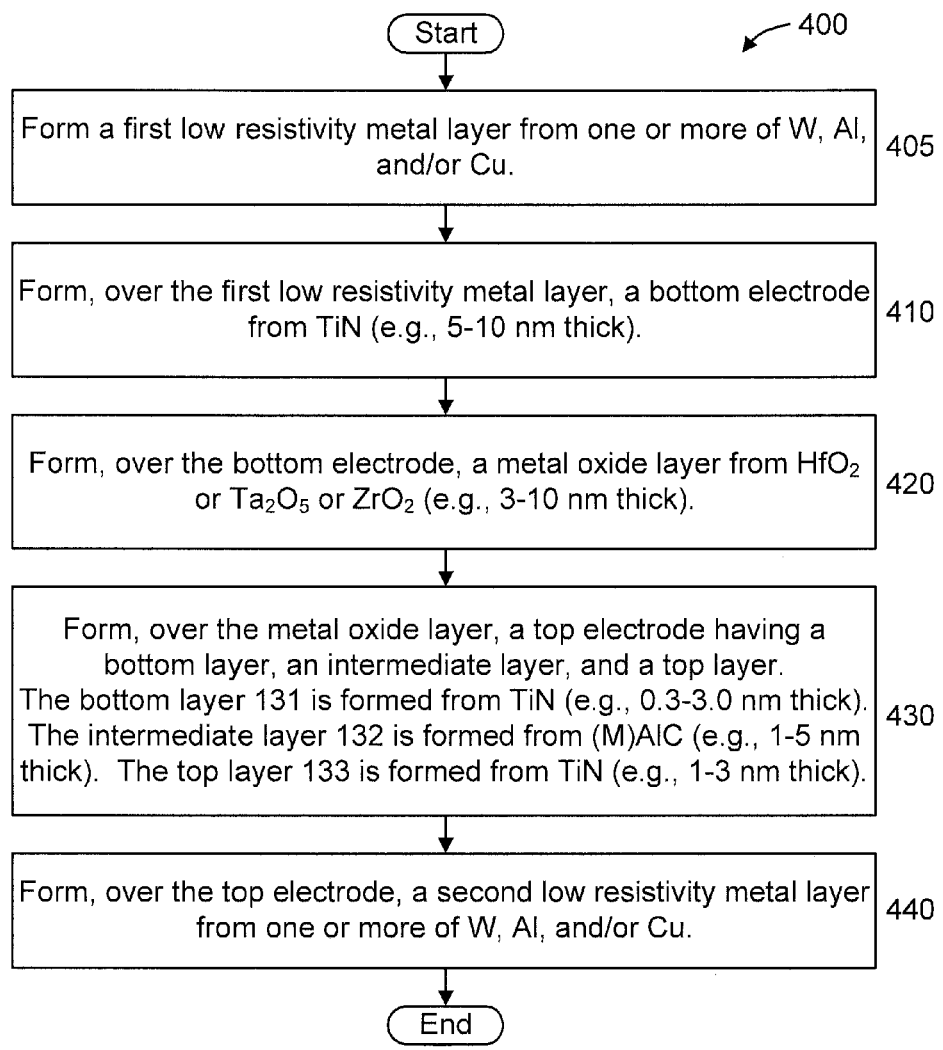
FIG. 4 shows another exemplary method 400 for forming a resistive switching memory stack for a 3D structure, in accordance with an embodiment of the present invention.

FIG. 4 shows another exemplary method 400 for forming a resistive switching memory stack for a 3D structure, in accordance with an embodiment of the present invention. The method 400 can form the stack, for example, with respect to any of the following: a Vertical Restive Random Access Memory (VRRAM); a deep Trench in Front End of Line (FEOL); a cylinder trench in Back End of Line (BEOL); and a fin structure.

At step 410, form a first low resistivity metal layer from one or more of W, Al, and/or Cu. Of course, other metals can be used for the first low resistivity metal layer, while maintaining the spirit of the present invention.

At step 420, form, over the first low resistivity metal layer, a bottom electrode from TiN. In an embodiment, the bottom electrode is 5-10 nm thick. Of course, other metals and/or thicknesses can be used for the bottom electrode, while maintaining the spirit of the present invention.

At step 430, form, over the bottom electrode, a metal oxide layer from $HfO_2$ or $Ta_2O_5$ or $ZrO_2$. In an embodiment, the metal oxide layer is 3-10 nm thick. Of course, other metals and/or thicknesses can be used for the metal oxide layer, while maintaining the spirit of the present invention.

At step 440, form, over the metal oxide layer, a top electrode having a bottom layer, an intermediate layer, and a top layer. The bottom layer is formed from TiN. In an embodiment, the bottom layer is 0.3-3.0 nm thick. The intermediate layer is formed from (M)AlC, where M is a transition metal. In an embodiment, the intermediate layer is 1-5 nm thick. The top layer 233 is formed from TiN. In an embodiment, the top layer 233 is 1-3 nm thick. Of course, other metals and/or thicknesses can be used for each of the layers of the top electrode, while maintaining the spirit of the present invention.

At step 450, form, over the top electrode, a second low resistivity metal layer from one or more of W, Al, and/or Cu. Of course, other metals can be used for the second low resistivity metal layer, while maintaining the spirit of the present invention.

It is to be appreciated that for the sake of illustration, various metals and metal oxides and various thickness for the metals and metal oxides have been described herein. However, as readily appreciated by one of ordinary skill in the art given the teachings of the present invention provided herein, these and other metals and metal oxides can also be used, as well as other thicknesses, while maintaining the spirit of the present invention. For example, regarding the electrodes described herein, such electrodes may include any suitable conductive material, such as polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of an apparatus and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A resistive switching memory stack, comprising:
a bottom electrode, formed from one or more metals;
a metal oxide layer, disposed over the bottom electrode, formed from an Atomic Layer Deposition (ALD) of one or more metal oxides; and
a top electrode, disposed over the metal oxide layer, formed from the ALD of a plurality of metals into a metal layer stack,
wherein a thickness of the plurality of metals forming the top electrode is configured to control an oxygen vacancy concentration of the resistive switching memory stack, wherein the top electrode includes a bottom layer, an intermediate layer, and a top layer, and wherein the bottom layer is formed from TiN,
wherein the intermediate layer is formed from (M)AlC, where M is a transition metal selected from the group consisting of Ti, Ta, and Nb.

2. The resistive switching memory stack of claim 1, wherein the bottom electrode is formed from TiN.

3. The resistive switching memory stack of claim 1, wherein the bottom electrode is 10-50 nm thick.

4. The resistive switching memory stack of claim 1, wherein the metal oxide layer is formed from a compound selected from the group consisting of $HfO_2$ or $Ta_2O_5$ or $ZrO_2$.

5. The resistive switching memory stack of claim 1, wherein the metal oxide layer is 3-10 nm thick.

6. The resistive switching memory stack of claim 1, wherein the bottom layer is 0.3-3.0 nm thick.

7. The resistive switching memory stack of claim 1, wherein the intermediate layer 132 is 1-5 nm thick.

8. The resistive switching memory stack of claim 1, wherein the top layer is formed from TiN.

9. The resistive switching memory stack of claim 1, wherein the top layer 133 is 10-50 nm thick.

10. The resistive switching memory stack of claim 1, wherein the intermediate layer is formed from (M)AlC, the top layer is formed from TiN.

11. The resistive switching memory stack of claim 1, wherein the resistive switching memory stack is formed in a Vertical Restive Random Access Memory (VRRAM).

12. The resistive switching memory stack of claim 1, wherein the resistive switching memory stack is formed in an item selected from the group consisting of a deep Trench in Front End of Line (FEOL), a cylinder trench in Back End of Line (BEOL), and a fin structure.

13. The resistive switching memory stack of claim 1, further comprising at least one low resistivity metal layer formed from one or more low resistivity metals, wherein at least one of the at least one low resistivity layer is formed under the bottom electrode or over the top electrode.

14. The resistive switching memory stack of claim 13, wherein the one or more low resistivity metals comprise W, Al, and Cu.

15. The resistive switching memory stack of claim 13, wherein the at least one low resistivity metal layer comprises a first low resistivity metal layer formed under the bottom electrode, and a second low resistivity metal layer formed over the top electrode.

16. The resistive switching memory stack of claim 15, wherein at least one of the one or more low resistivity metals in the first low resistivity metal layer is different than that in the second low resistivity metal layer.

17. A method for forming a resistive switching memory stack, the method comprising:
forming a bottom electrode from one or more metals;
forming a metal oxide layer, disposed over the bottom electrode, from and Atomic Layer Deposition (ALD) of one or more metal oxides; and
forming a top electrode, disposed over the metal oxide layer, from the ALD of a plurality of metals into a metal layer stack,
wherein a thickness of the plurality of metals forming the top electrode is configured to control an oxygen vacancy concentration of the resistive switching memory stack, wherein the top electrode includes a bottom layer, an intermediate layer, and a top layer, wherein the bottom layer is formed from TiN, and wherein the intermediate layer is formed from (M)AlC, where M is a transition metal selected from the group consisting of Ti, Ta, and Nb.

* * * * *